(12) United States Patent
Yao

(10) Patent No.: US 8,456,732 B2
(45) Date of Patent: Jun. 4, 2013

(54) LIGHT SOURCE WAVELENGTH MODULATOR

(75) Inventor: Pei-Chih Yao, Jhonghe (TW)

(73) Assignee: ACPA Energy Conversion Devices Co., Ltd., Jhonghe, Taipei County (TW)

( * ) Notice: Subject to any disclaimer, the term of this patent is extended or adjusted under 35 U.S.C. 154(b) by 422 days.

(21) Appl. No.: 12/760,224

(22) Filed: Apr. 14, 2010

(65) Prior Publication Data

US 2010/0328754 A1 Dec. 30, 2010

(30) Foreign Application Priority Data

Jun. 30, 2009 (TW) .............................. 98211789 U

(51) Int. Cl.
*G02B 26/00* (2006.01)
*F21V 9/16* (2006.01)
*F21V 3/00* (2006.01)
*F21V 11/00* (2006.01)

(52) U.S. Cl.
USPC ................. 359/294; 372/26; 372/79; 372/80; 362/84; 362/257; 362/293; 362/311.01; 362/510

(58) Field of Classification Search
USPC ................... 359/294; 372/26, 79, 80; 362/84, 362/257, 293, 311.01–311.05, 510
See application file for complete search history.

(56) References Cited

U.S. PATENT DOCUMENTS

2009/0201577 A1* 8/2009 LaPlante et al. .............. 359/355

* cited by examiner

*Primary Examiner* — Evelyn A. Lester
(74) *Attorney, Agent, or Firm* — Muncy, Geissler, Olds & Lowe, PLLC

(57) ABSTRACT

A light source wavelength modulator includes a substrate made of a material with a high light transmittance and a thermal conduction effect, a wavelength modulation layer formed on the substrate and made of a wavelength modulation material, and patternized or multilayered, and further having a spacer between the wavelength modulation layer and its corresponding light source for achieving the best light source wavelength modulation, such that a portion of light spectrum of an original solar light or LED having no response or poor response to the light receiver is converted into a range of the best application efficiency for improving the utility efficiency of the light source. The white light emitted from the LED is gone through a wavelength modulation to enhance the light emitting color rendering, conversion efficiency and using life.

13 Claims, 4 Drawing Sheets

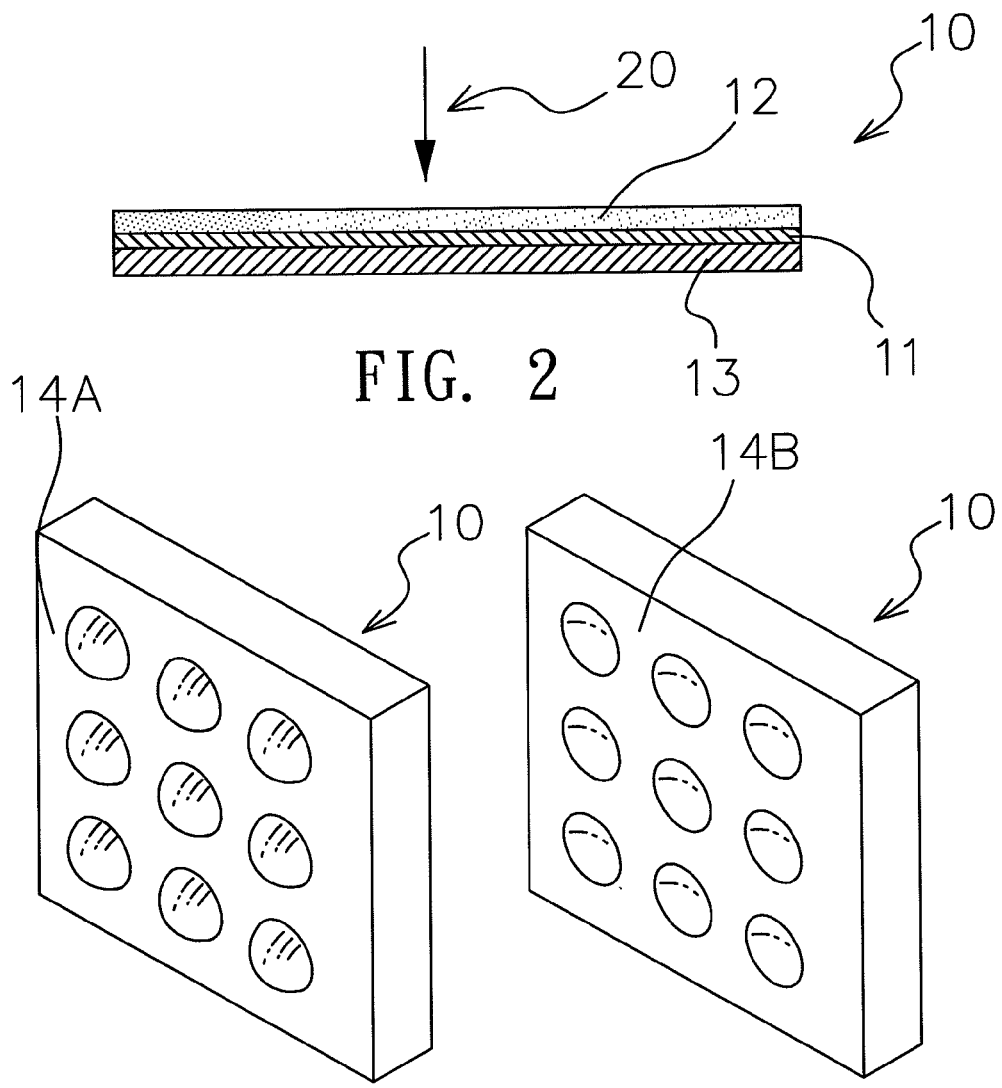
FIG. 2
FIG. 3A
FIG. 4A
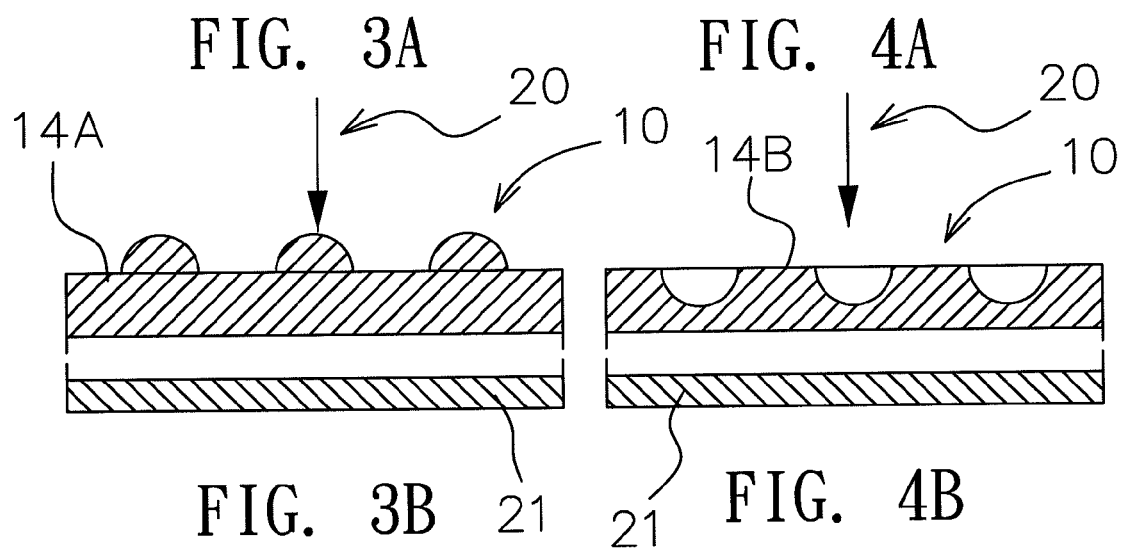
FIG. 3B
FIG. 4B

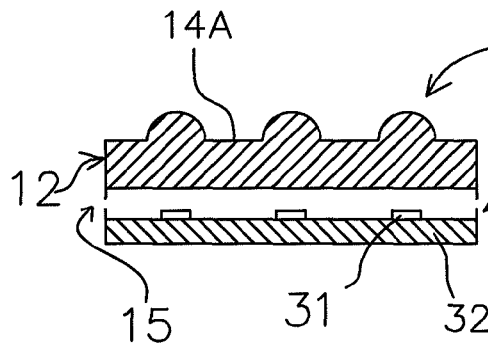
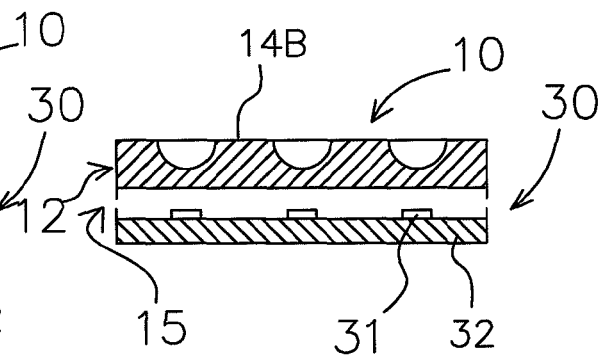
FIG. 5A  FIG. 5B
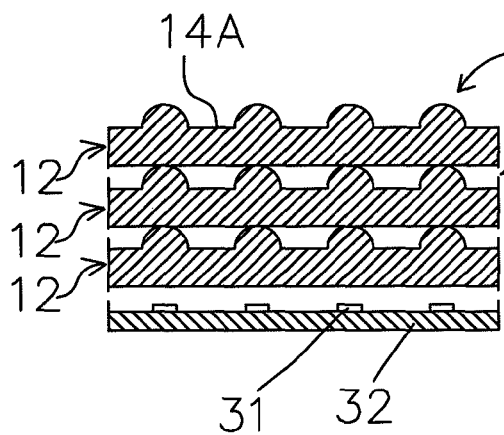
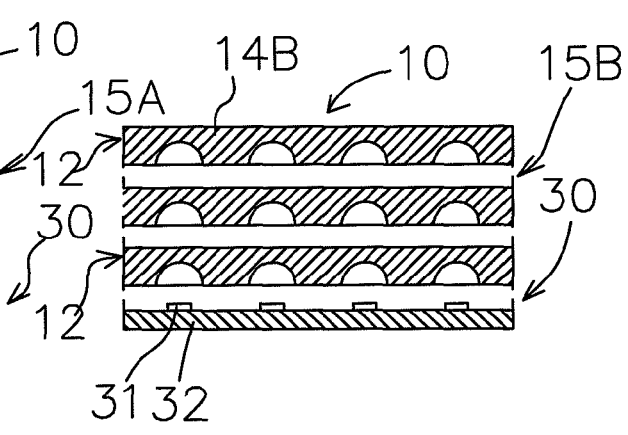
FIG. 6A  FIG. 6B

LIGHT SOURCE WAVELENGTH MODULATOR

BACKGROUND OF THE INVENTION

1. Field of the Invention

The present invention relates to a wavelength modulator, and more particularly to a light source wavelength modulator for modulating a wavelength of a light source, such that a light spectrum domain with no response or poor response to the receiver is converted into the wavelength domain with the best application performance.

2. Description of the Related Art

Light energy technology is an important research and development subject for the application of energy, of which solar energy is one of the examples. Although the response of a solar cell to a light wavelength varies with different materials, yet the utility efficiency of the light energy can be improved significantly, if the original solar spectrum is converted into a greater wave band where the solar cell having better spectrum responsivity response. With reference to FIG. 1 for a graph of spectrum versus wavelength of sunlight, a spectral curve 90 is roughly divided into three spectral domains according to the wavelength, and the three spectral domains are an ultraviolet domain 92, a visible light domain 91 and an infrared domain 93, wherein the portion of visible light domain 91 and a portion of its adjacent infrared domain 93 are the spectral domains having the best utility efficiency of present existing solar photovoltaic cells, and thus it is an important subject for the research and development on how to expand the ultraviolet domain 92 of the spectral curve 90 into the visible light domain 91 and a portion of the infrared domain 93 having a greater wavelength.

In addition, the light energy application of light emitting diodes (LED) is also an important subject, particularly the development of illumination equipments in the present optoelectronic industry, and the present LED white light emission is achieved by coating a phosphor material onto an LED chip, and packaging the LED chip integrally as a whole, so that excited light beams of the phosphor material and remaining excited light beams emitted by the LED are mixed to form the white light, but the light source is in direct contact with the phosphor material in this case, so that the heat (or high temperature) produced by the light source will deteriorate the phosphor material and result in a lower light efficiency or a color fading phenomenon, and thus improvements and breakthroughs are required to overcome the foregoing shortcomings of the prior art.

In view of the description above, the inventor of the present invention based on years of experience in the related industry to conduct extensive researches and experiments, and finally developed a light source wavelength modulator in accordance with the present invention.

SUMMARY OF THE INVENTION

Therefore, it is a primary objective of the present invention to provide a light source wavelength modulator, adopting a spacer technology to form a spacer with an indirect contact between a phosphor material and a light source, and the wavelength modulator converts a light spectrum of an original solar cell having no response or poor response into a range or domain with the best application efficiency to improve the utility efficiency of the light source.

Another objective of the present invention is to provide a light source wavelength modulator wherein the white light emission of LEDs, the spacer technology with an indirect contact between a phosphor material and a light source, and a wavelength modulator are used for enhancing the light emission efficiency and the using life.

To achieve the foregoing objectives, the present invention provides a light source wavelength modulator comprising: a substrate made of a material having good light transmittance and thermal conduction; a wavelength modulation layer, disposed on the substrate, and made of a wavelength modulation material, and having a spacer formed with an indirect between the wavelength modulation layer and the corresponding light source.

The light source wavelength modulator in accordance with the present invention further comprises a wavelength modulation layer composed of a plurality of phosphor powder materials with different wavelength conversions and installed with a patternization or a localization and a single-layer or a multilayer method for achieving the best light source wavelength modulation, such that the light spectrum of an original solar cell with no response or poor response is converted into a range of the best application efficiency to improve the utility efficiency of the light source, and a white light emission of the LED and a wavelength modulation are adopted for improving the emitted light color rendering, conversion efficiency and using life.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

FIG. 2 is a cross-sectional view of a structure in accordance with a first preferred embodiment of the present invention;

FIG. 3A is a first schematic view of a phosphor layer pattern in accordance with a first preferred embodiment of the present invention;

FIG. 3B is a first cross-sectional view of a phosphor layer pattern in accordance with a first preferred embodiment of the present invention;

FIG. 4A is a second schematic view of a phosphor layer pattern in accordance with a first preferred embodiment of the present invention;

FIG. 4B is a second cross-sectional view of a phosphor layer pattern in accordance with a first preferred embodiment of the present invention;

FIG. 5A is a first schematic view of a second preferred embodiment of the present invention;

FIG. 5B is a second cross-sectional view of a second preferred embodiment of the present invention;

FIG. 6A is a first cross-sectional view of a third preferred embodiment of the present invention;

FIG. 6B is a second cross-sectional view of a second preferred embodiment of the present invention;

Figure 1:
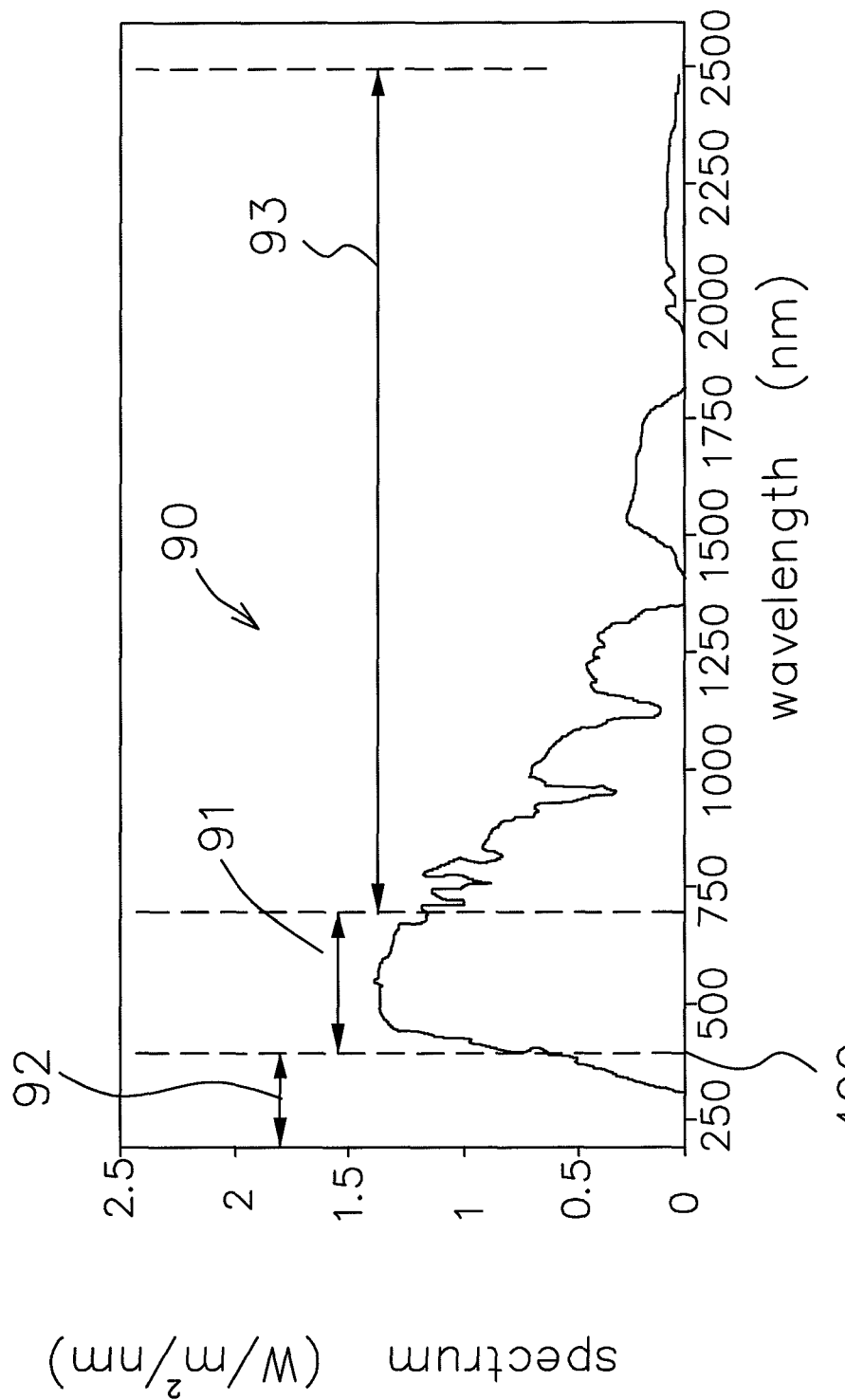
FIG. 1 is a graph of spectrum versus wavelength of sunlight.

The representative drawing of the invention is FIG. 6A.

Numerals for respective elements in the drawings are given below:

| | |
|---|---|
| Light source wavelength modulator 10 | Thin film 11 |
| Wavelength modulation layer 12 | Substrate 13 |
| Convex domain layer 14A | Concave domain layer 14B |
| Spacer 15, 15A, 15B, 15C | |
| Light source 20 | Solar cell 21 |
| Light emitting diode 30 | LED chip 31 |
| Heat dissipation circuit substrate 32 | Spectral curve 33 |
| First spectral curve 34 | Second spectral curve 35 |
| Third spectral curve 36 | |

DETAILED DESCRIPTION OF THE PREFERRED EMBODIMENTS

The technical characteristics of the present invention will become apparent with the detailed description of the preferred embodiments and the illustration of the related drawings as follows.

With reference to FIG. 2 for a cross-sectional view of a structure in accordance with a first preferred embodiment of the present invention, the light source wavelength modulator 10 comprises a wavelength modulation layer 12 and a substrate 13, wherein the substrate 13 is a carrier, made of a material with a good light transmittance (such as a glass plate, an acrylic plate, a plastic plate, or a transparent ceramic plate) and provided for passing an ultraviolet light, a visible light or an infrared light wavelength, and the substrate 13 further includes a thin film 11 made of a material with good light transmittance, thermal conduction and electric conduction (such as a transparent diamond thin film, a nano carbon tube thin film or an indium tin oxide (ITO) thin film, and the wavelength modulation layer 12 is disposed on the thin film 11, and the wavelength modulation layer 12 is made of material with a wavelength modulation function, such as a phosphor powder, and the wavelength modulation material can be a carrier made of an organic polymer, and the carrier includes an organic wavelength modulation material, an inorganic quantum dot phosphor color rendering modulation material and an organic nanoparticle enhanced-light phosphor or an inorganic phosphor material and a combination nor a composite material of the above, and the wavelength modulation material can convert light with a short wavelength into light with a long wavelength (or vice versa); and the wavelength modulation layer 12 is provided for passing and projecting the light source 20 (or sunlight) and changing the wavelength of the light source 20, so that a light spectrum with no response or poor wavelength response to the original solar cell 21 (as shown in FIGS. 3B and 4B) is converted into a range of the best spectrum response of the solar cell and improve the utility efficiency of the light source.

In addition, the wavelength modulation layer 12 can be single layered or multilayered, coated to form a thin film, a thick film or a plate, and installed (completely or partially) on the thin film 11 of the substrate 13, and the wavelength modulation layer 12 is formed by mixing a plurality of phosphor powder materials having different wavelength conversions with an organic polymer carrier. In an appropriate embodiment, the wavelength modulation layer 12 is patterned (or localized), and the substrate 13 includes a convex domain layer 14A formed by the wavelength modulation layer 12 as shown in FIGS. 3A and 3B, or the substrate 13 includes a concave domain layer 14B formed by the wavelength modulation layer 12 as shown in FIGS. 4A and 4B, so that the convex domain layer 14A or the concave domain layer 14B (or the reflective layer or any other shape) with a geometric optical function formed by the phosphor layer pattern works together with the traveling path of the light source 20 (or sunlight) to produce a light condensation, a color dispersion, a diffuser effect, so as to improve the absorption rate of the light source 20 (or sunlight) for the solar cell 21.

With reference to FIGS. 5A and 5B for a source wavelength modulator in accordance with a second preferred embodiment of the present invention light, this preferred embodiment is modified from the basic structure of the first preferred embodiment, wherein the light source is a light emitting diode (LED) 30, and the LED 30 includes at least one or more LED chips 31 installed on a heat dissipation circuit substrate 32, and a spacer 15 (which is air or a dielectric material with a refractive index matching) is formed with an indirect contact between the LED 30 and the wavelength modulation layer 12), and the light emitted from the LED chip 31 is passed through the convex domain layer 14A or the concave domain layer 14B (or another pattern) formed by a pattern of the wavelength modulation layer 12 to produce the light condensation, color scattering, or diffuser effect, so as to expand the emission range of producing the white light, and the wavelength modulation layer 12 will not be affected by the heat or high temperature of the LED 30 (or light source) to prevent the deterioration of the phosphor powder, so as to enhance the light emission efficiency and using life.

Figure 6C:
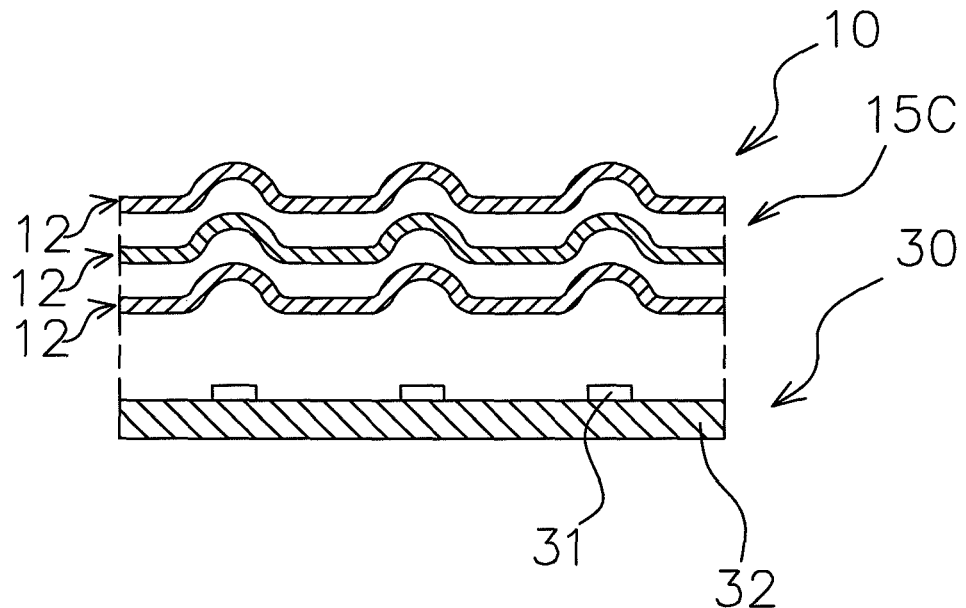
FIG. 6C is a third cross-sectional view of a second preferred embodiment of the present invention.

With reference to FIGS. 6A, 6B and 6C for a light source wavelength modulator in accordance with a third preferred embodiment of the present invention, this preferred embodiment is modified from the basic structure of the first preferred embodiment, wherein the wavelength modulation layer 12 is multilayered, and a spacer 15A, 15B, 15C (which is air, or a dielectric material with a refractive index matching) is formed with an indirect contact between the wavelength modulation layer 12. In addition, each wavelength modulation layer 12 can be formed according to different wavelength materials. For example, the phosphor material of the wavelength modulation layer 12 at a lower layer (or a near-light layer, which is proximate to a light source) has a luminescence quantum efficiency greater than or equal to an upper layer (or a far-from-light layer, which is far from the light source) or any other layout. If the light emitted from the LED 30 (or the light source 20) is passed through of the multilayer wavelength modulation layer 12 (or the near-light layer), the wavelength is modulated gradually (or from layer to layer) until a spectral wave band advantageous for producing white light (or a spectral wave band of the solar cell has a high wavelength responsivity of sunlight) is achieved.

Figure 7:
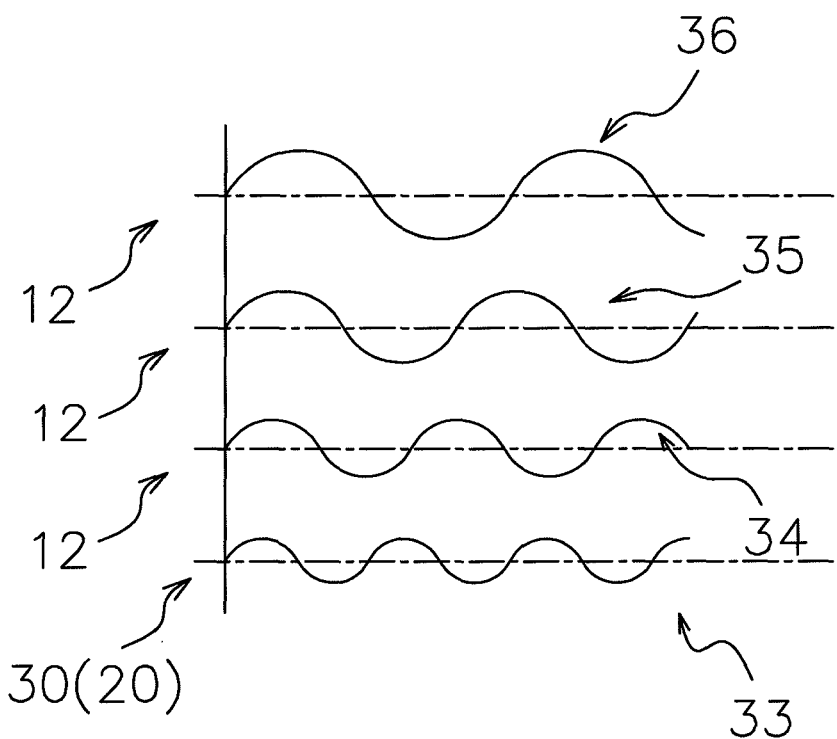
FIG. 7 is a schematic view showing spectral curves in accordance with a third preferred embodiment of the present invention.

In FIG. 7, a spectral curve 33 of an original light of the light source 20 (such as sunlight, a fluorescent lamp or an LED) is gone through a modulation of the first wavelength modulation layer 12 to produce a first spectral curve 34 with a longer wavelength, and then gone through a modulation of the second wavelength modulation layer 12 to produce a second spectral curve 35 with a much longer wavelength, and finally gone through a modulation of a third wavelength modulation layer 12 to produce a third spectral curve 36 with the longest wavelength among the three, and the third spectral curve 36 indicates the greatest wavelength responsivity of the solar cell or LED or the most advantageous spectral wave band for producing white light.

The light source wavelength modulator of the present invention adopts a spacer technology applied between a wavelength modulation material and a light source, and uses a wavelength modulation layer formed by mixing a plurality of phosphor powder materials with different wavelength conversions, and the phosphor layer is a multilayer phosphor layer formed by patternization to achieve the light source wavelength modulation, so as to convert the light spectrum with no response or poor wavelength response to the original solar cell into a range with the best spectrum response of the solar cell and then enhance the utility efficiency of the light source, and a white light emission of the LED is used for the wavelength modulation to enhance the light emission efficiency and the color rendering and lower the aging rate.

In summation of the description above, the present invention complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A light source wavelength modulator, comprising:
    a substrate, made of a material having a high light transmittance and a thermal conduction effect;
    a wavelength modulation layer in a multilayer form, formed on the substrate, and made of a wavelength modulation material, and a spacer with an indirect contact being disposed between the wavelength modulation layer and a corresponding light source.

2. The light source wavelength modulator of claim 1, wherein the substrate further includes a thin film formed on the substrate, and the wavelength modulation layer is disposed on the thin film.

3. The light source wavelength modulator of claim 2, wherein the substrate is a penetrative transparent material selected from the collection of a glass plate, an acrylic plate, a plastic plate or a transparent ceramic plate.

4. The light source wavelength modulator of claim 2, wherein the thin film is made of a material featuring high light transmittance, thermal conduction and electrical conduction and selected from the collection of a diamond thin film, a nano carbon tube thin film and an indium tin oxide thin film.

5. The light source wavelength modulator of claim 1, wherein the wavelength modulation layer includes a phosphor powder or an organic polymer used as a carrier, and the carrier includes a material selected from the collection of an organic wavelength modulation material, an inorganic quantum dot phosphor color rendering modulation material, an organic nanoparticle light-enhanced phosphor or inorganic phosphor material, and a combination or a composite material of the above.

6. The light source wavelength modulator of claim 1, wherein the wavelength modulation layer is formed by mixing a phosphor powder having a various different wavelength conversion with an organic polymer carrier.

7. The light source wavelength modulator of claim 1, wherein the wavelength modulation layer is patternized or localized.

8. The light source wavelength modulator of claim 7, wherein the pattern includes a convex domain layer, a concave domain layer, or a reflective layer with a geometric optical function.

9. The light source wavelength modulator of claim 1, further comprising a spacer disposed between the wavelength modulation layers.

10. The light source wavelength modulator of claim 9, wherein the spacer between the wavelength modulation layers is composed of air or a dielectric material with a refractive index matching.

11. The light source wavelength modulator of claim 1, wherein the spacer between the wavelength modulation layer and the light source is composed of air or a dielectric material with a refractive index matching.

12. The light source wavelength modulator of claim 1, wherein the wavelength modulation layer proximate to the light source has a luminescence quantum efficiency greater than or equal to that of the wavelength modulation layer of a far-from-light layer.

13. The light source wavelength modulator of claim 1, wherein the light source is a light emitting diode, a fluorescent lamp or sunlight.

* * * * *